(12) United States Patent
Fan et al.

(10) Patent No.: US 10,504,801 B2
(45) Date of Patent: Dec. 10, 2019

(54) METHOD AND APPARATUS FOR DETECTING AND REMOVING DEFECTIVE INTEGRATED CIRCUIT PACKAGES

(71) Applicant: Texas Instruments Incorporated, Dallas, TX (US)

(72) Inventors: Zheng Qing Fan, Chengdu (CN); Hui Yin, Chengdu (CN); Qing Bo Wu, Chengdu (CN); Tian Sheng Chen, Chengdu (CN); Guan Quan Wen, Chengdu (CN); Ding Han, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/437,737

(22) Filed: Feb. 21, 2017

(65) Prior Publication Data

US 2018/0114733 A1 Apr. 26, 2018

Related U.S. Application Data

(63) Continuation of application No. PCT/CN2016/102753, filed on Oct. 20, 2016.

(51) Int. Cl.
*H01L 21/66* (2006.01)
*H01L 21/48* (2006.01)
(Continued)

(52) U.S. Cl.
CPC .......... *H01L 22/20* (2013.01); *H01L 21/4821* (2013.01); *H01L 21/561* (2013.01); *H01L 21/67271* (2013.01); *H01L 21/67282* (2013.01); *H01L 21/67294* (2013.01); *H01L 23/3114* (2013.01); *H01L 23/544* (2013.01); *H01L 24/75* (2013.01); *H01L 24/78* (2013.01); *H01L 24/83* (2013.01); *H01L 24/85* (2013.01); *H01L 24/92* (2013.01); *H01L 24/97* (2013.01); *H01L 22/12* (2013.01); *H01L 23/3107* (2013.01); *H01L 23/49541* (2013.01); *H01L 24/45* (2013.01); *H01L 24/48* (2013.01); *H01L 24/73* (2013.01); *H01L 2223/54433* (2013.01);
(Continued)

(58) Field of Classification Search
USPC .................... 257/E23.001, 676, 774; 29/705
See application file for complete search history.

(56) References Cited

U.S. PATENT DOCUMENTS

6,931,298 B1 * 8/2005 Chang ............... H01L 21/67276
257/E21.525
7,235,421 B2 * 6/2007 Chopra .................. H01L 23/373
257/E21.327
(Continued)

*Primary Examiner* — Telly D Green
(74) *Attorney, Agent, or Firm* — Ronald O. Neerings; Charles A. Brill; Frank D. Cimino (57) ABSTRACT

A method for making integrated circuit (IC) packages includes providing a leadframe strip having a plurality of leadframe units and providing the leadframe strip to an operating station. The operating station is operable to perform one or more tests on the plurality of leadframe units in the making of IC packages. The method includes obtaining a database that has the locations of leadframe units in the leadframe strip stored in the database. The method also includes performing the one or more tests on the plurality of leadframe units and updating the database in response to the results of the testing.

27 Claims, 8 Drawing Sheets

(51) Int. Cl.
*H01L 21/56* (2006.01)
*H01L 21/67* (2006.01)
*H01L 23/31* (2006.01)
*H01L 23/544* (2006.01)
*H01L 23/00* (2006.01)
*H01L 23/495* (2006.01)

(52) U.S. Cl.
CPC ............... *H01L 2223/54486* (2013.01); *H01L 2224/32245* (2013.01); *H01L 2224/45144* (2013.01); *H01L 2224/48091* (2013.01); *H01L 2224/48106* (2013.01); *H01L 2224/48247* (2013.01); *H01L 2224/49176* (2013.01); *H01L 2224/73265* (2013.01); *H01L 2224/7598* (2013.01); *H01L 2224/75901* (2013.01); *H01L 2224/7898* (2013.01); *H01L 2224/78901* (2013.01); *H01L 2224/83908* (2013.01); *H01L 2224/859* (2013.01); *H01L 2224/92247* (2013.01)

(56) References Cited

U.S. PATENT DOCUMENTS

| | | | |
|---|---|---|---|
| 7,818,085 B1* | 10/2010 | Chang | H01L 21/67276 156/351 |
| 2005/0090024 A1* | 4/2005 | Chopra | H01L 23/373 438/14 |
| 2012/0066899 A1* | 3/2012 | Sirinorakul | H01L 22/14 29/705 |
| 2013/0026643 A1* | 1/2013 | England | H01L 21/561 257/774 |
| 2018/0003737 A1* | 1/2018 | Preston | G01R 1/07378 |

* cited by examiner

METHOD AND APPARATUS FOR DETECTING AND REMOVING DEFECTIVE INTEGRATED CIRCUIT PACKAGES

BACKGROUND

Leadframes are found in virtually all integrated circuit (IC) packages. Leadframes electrically connect IC dies to other electrical components within an IC package. Leadframes also connect electrical components in the IC package to electrical circuitry outside the IC package. In addition, leadframes act as a base structure upon which other IC components are mounted.

Leadframes are initially formed by etching or stamping a thin, flat sheet of metal (usually copper, aluminum, or gold) to form a leadframe strip. Each leadframe strip usually contains several longitudinally spaced apart leadframe panels. Each panel, in turn, comprises an array of integrally connected leadframes arranged in a rectangular grid that is bordered on all four sides by unformed portions of the leadframe strip. Each leadframe strip undergoes a series of processes that ultimately produce multiple, separate IC packages. Each IC package typically includes at least one leadframe, at least one die mounted on the leadframe and electrically connected to the leadframe, and a hard protective coating of cured mold compound. The mold compound covers and protects the leadframe and die(s) and any other package components. Portions of leadframe leads are exposed to enable connection of the IC package circuitry to outside circuitry.

The processes that a leadframe undergoes during IC package formation usually produce a number of defective IC packages. These defective IC packages must be detected and removed before the IC packages are shipped to customers.

SUMMARY

A method for making integrated circuit (IC) packages includes providing a leadframe strip having a plurality of leadframe units and providing the leadframe strip to an operating station. The operating station is operable to perform one or more tests on the plurality of leadframe units in the making of IC packages. The method includes obtaining a database that has the locations of leadframe units in the leadframe strip stored in the database. The method also includes performing the one or more tests on the plurality of leadframe units and updating the database in response to the results of the testing.

An integrated circuit (IC) package production device for performing at least one procedure in the production of IC packages on a plurality of leadframe units that are affixed to a leadframe strip. The leadframe strip has strip identifying indicia located on it. The IC package production device includes a reader operable to read the strip identifying indicia affixed to the leadframe strip. The production device has a mechanism operable to perform one or more production procedures on the plurality of leadframe units. The production device has a processor operable to correlate the identification of the leadframe strip to a database that identifies locations of leadframe units on the leadframe strip. The processor is operable to update the database to identify locations of leadframe units on which the one or more production procedures were performed.

An integrated circuit (IC) test station for testing a plurality of leadframe units affixed to a leadframe strip. The leadframe strip has identification indicia located on it. The station includes a reader operable to read the identification indicia affixed to the leadframe strip. The station also includes a testing device operable to test the plurality of leadframe units. The station has a processor operable to correlate the identification of the leadframe strip to a database that identifies locations of leadframe units on the leadframe strip. The processor is also operable to update the database to identify locations of leadframe units in response to the testing performed by the testing device.

DETAILED DESCRIPTION

This disclosure describes various processes performed during integrated circuit (IC) package production. Certain terminology used herein will now be described. The phrase "leadframe strip" refers to a stamped or etched metal plate containing integrally connected leadframes. A leadframe strip enters the first stage of an IC package production line and various production processes are performed on it as it proceeds through the production line. After one or more operations are performed on the leadframe strip, the resulting leadframe strip assembly is still referred to herein as a "leadframe strip." The phrase "leadframe unit" is used herein to refer to an unprocessed leadframe on the leadframe strip. "Leadframe unit," as used herein, also means a leadframe with any other structure or material attached to it, for example, a leadframe with an attached die. A leadframe unit that has been encapsulated and singulated from a leadframe strip is referred to herein as a "singulated leadframe unit" or an "integrated circuit (IC) package."

Figure 1:
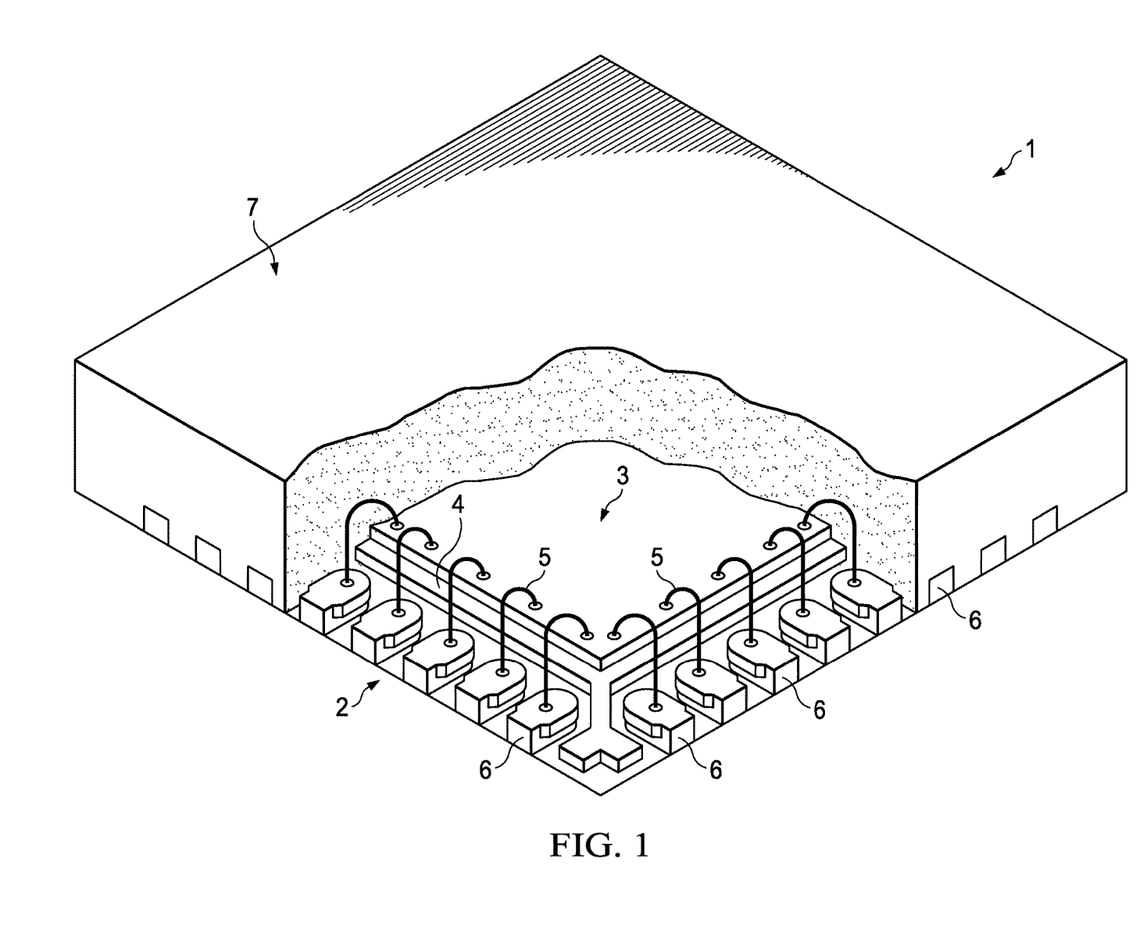
FIG. 1 is a broken away isomeric view of an integrated circuit (IC) package.

FIG. 1 is a broken away isomeric view of an integrated circuit (IC) package 1. The IC package 1 includes a leadframe 2 and an integrated circuit die 3 mounted on a die pad 4 of the leadframe 2. Bond wires 5 connect surface contacts on the die 3 with leads 6 of the leadframe 2. An encapsulating mold compound block 7 covers the leadframe 2, die 3 and bond wires 5. Bottom and side surfaces of the leads 6 and the bottom surface of the die pad 4 are exposed through the mold compound block 7.

Figure 2:
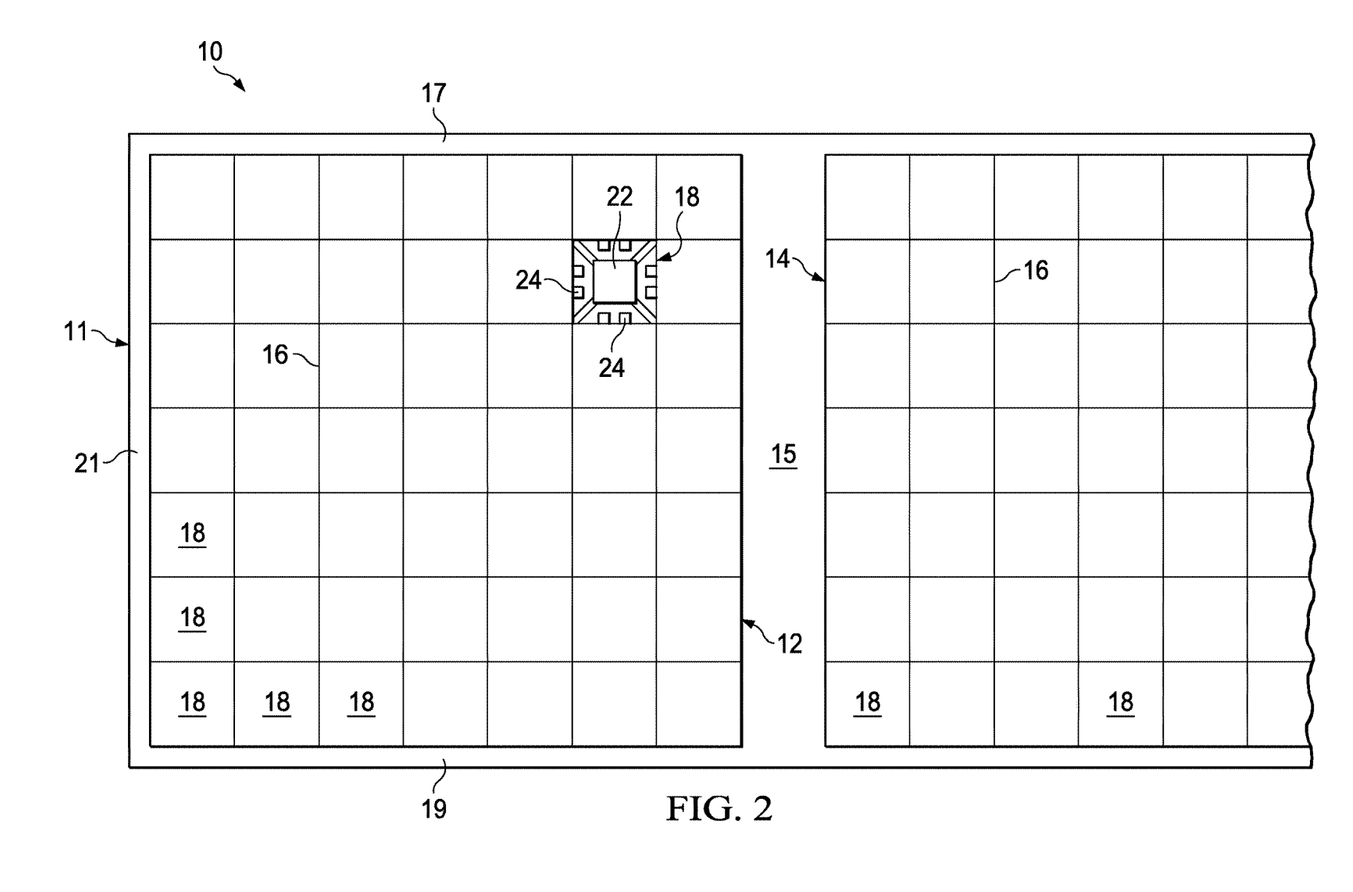
FIG. 2 is a schematic top plan view of a leadframe strip.

FIG. 2 is a schematic top plan view of a leadframe strip 10 having a plurality of leadframe panels 12, 14, etc., separated by panel spacer portions 15. Each panel 12, 14, etc., is arranged in a grid 16 of integrally connected leadframe units 18. In the example of FIG. 2, the grid 16 is square, but it may have other shapes in other examples. FIG. 2 shows a 7×7 arrangement of leadframe units in each panels, but the number of leadframe units in any particular leadframe panel or strip is a matter of design choice and is typically greater than that shown schematically in FIG. 2. The leadframe strip 10 has a peripheral border portion 11 including a top rail 17, a bottom rail 19, and opposite end rails 21 (only one shown). Although leadframe units come in various configurations, most include at least one centrally positioned die attachment pad 22 and a plurality of peripheral leads 24, as shown schematically in one leadframe unit 18 in FIG. 2.

Figure 3:
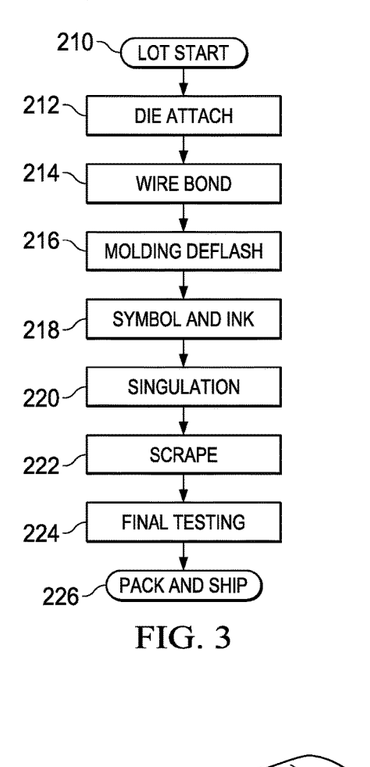
FIG. 3 is a flow diagram of an IC package production line.

FIG. 3 is a flow diagram of an IC package production line 200. A leadframe strip, such as leadframe strip 10, FIG. 2, enters the production line 200 at a first station 210. The leadframe strip then enters a die attach station 212 where integrated circuit dies, e.g., die 3, FIG. 1, are attached to corresponding die attach pads, such as die attach pad 22, FIG. 2. Die attachment may involve solder attachment or adhesive attachment. The attachment medium may be electrically conductive or nonconductive depending upon the IC package design.

One or more testing devices (not shown) are used at the die attach station 212 to test the leadframe units for defects occurring during die mounting. Common testing devices used at die attach stations include, for example, a Pattern Recognition (PR) System. The results of defect testing with one or more testing devices at the die attach station 212 are provided in human readable form, for example in a paper print out or on a video display. The recording of defects will now be briefly described with reference to FIGS. 4 and 5, before describing the remainder of the production line 200.

Figure 4:
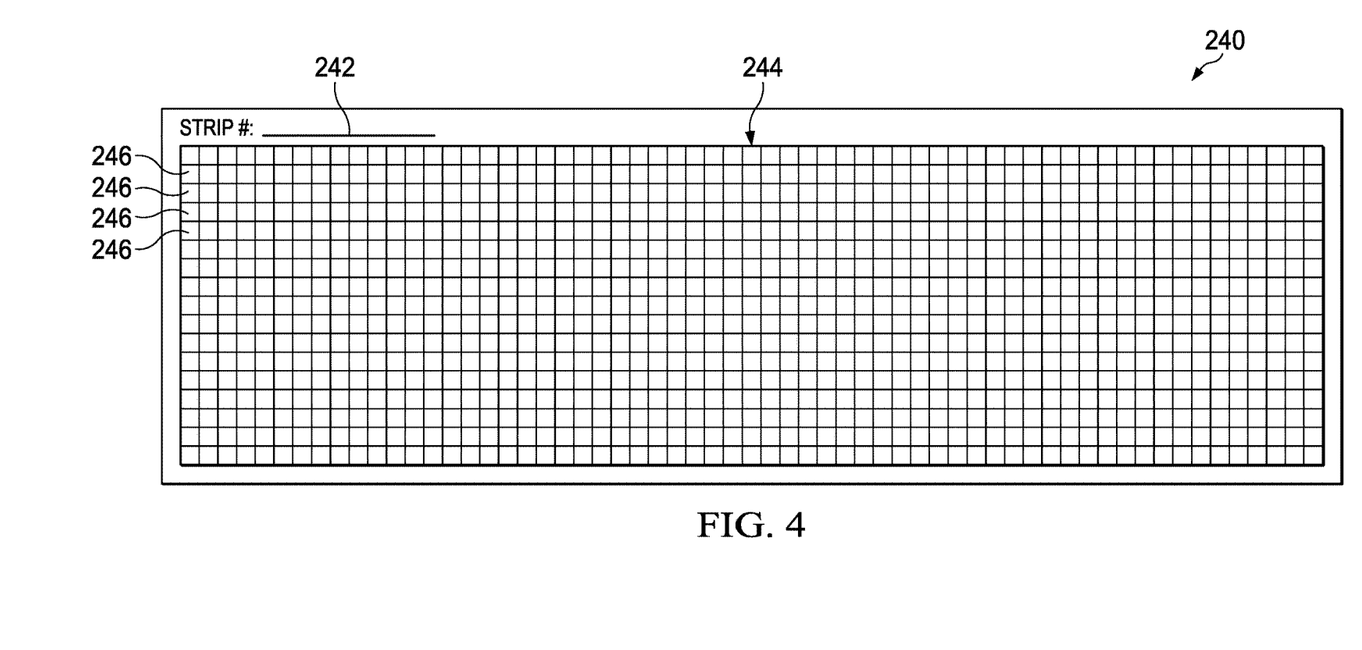
FIG. 4 is a top plan view of a leadframe strip paper map.

FIG. 4 is a top plan view of a leadframe strip paper map 240. The leadframe strip paper map 240 has a blank space 242 for writing in the leadframe strip identification indicia (e.g. a leadframe strip number). The leadframe strip paper map 240 has a grid 244 of cells 246 arranged in rows and columns. An appropriate leadframe strip paper map 240 may be used such that a selected portion of its grid 244 corresponds to the leadframe panel grids, e.g., 12, 14, of a subject leadframe strip, e.g., leadframe strip 10, FIG. 2. Alternatively, the leadframe strip paper map 240 may be printed with a grid 244 that corresponds exactly to the leadframe arrangement of the leadframe strip.

Figure 5:
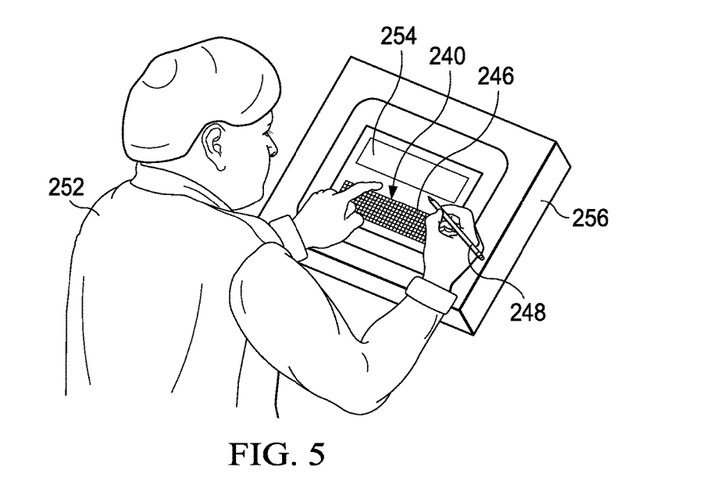
FIG. 5 is an isometric view of an operator performing a manual process for recording the location of defective leadframe units on a leadframe strip paper map.

FIG. 5 illustrates an operator 252 performing a manual process of recording the locations of defective leadframe units with a marking instrument 248 on a leadframe strip paper map 240. The operator 252 views the display 254 of a monitor 256 that is operatively associated with a die attach station 212 testing device. The display 254 indicates which leadframe units on a leadframe strip processed by the die attach station were determined to be defective by the testing device. The operator 252, after viewing the display 254, marks the leadframe strip paper map cells 246 that correspond to the locations of defective leadframe units indicated by the display 254. This process is very tedious and is highly subject to human error. There are many small cells 246 on the leadframe strip paper map 240, and it is very easy for an operator to accidentally shift the paper map 240 one cell to the left, right, up or down while marking it. The result of such an inadvertent shift would be marking good cells as defective and not marking the defective cells as defective.

Referring again to FIG. 3, after leaving the die attach station 212, the leadframe strip 10, FIG. 2, enters the wire bond station 214. At the wire bond station 214, the dies that were mounted on the leadframe die attach pads, e.g., pads 22, FIG. 2, at the die attach station 212 are now electrically attached to corresponding leadframe leads, e.g., leads 24, FIG. 2. The wire bonding process is essentially a welding process during which a fixture known as a capillary uses heat and pressure to attach opposite ends of a thin bond wire, e.g., a gold bond wire 5, FIG. 1, to a die and a lead, e.g. die 3 and lead 6, FIG. 1. Testing devices, such as a Bond Integrity Test System (BITS) or a Pattern Recognition (PR) System are used to detect leadframe units with defective wire bonds. The manual process described above with reference to FIGS. 4 and 5 for recording the locations of defective leadframe units on the paper leadframe strip map 240 is now essentially repeated at the wire bond station 214. The defects detected at the wire bond station are generally bond wire attachment defects or other defects caused by the heat and pressure produced by the capillary.

Next the leadframe strip, e.g. 10, FIG. 2, with attached dies and wire bonds moves to the molding/deflash station 216. At this station, the leadframe strip 10 is encapsulated. In some examples, encapsulation includes covering the leadframe strip and attached electrical components with molten mold compound, which cures to a hard, protective covering. After the leadframe strip is encapsulated, mold deflashing is performed. Any defects detected during these processes are typically detected by an operator, sometimes with the aid of a magnifying video monitor. Any detected defective leadframe units are manually recorded on the leadframe strip paper map 240 by the operator 252 as described above.

Next the leadframe strip enters the symbol operating station 218 where all leadframe units are "symbolled," i.e., machine marked with indicia that convey certain information about the leadframe unit, such as a pin 1 indicator, a device code and a lot tracing code. At the symbol operating station 218, or another station downstream therefrom, operators "ink," i.e., manually mark the defective leadframe units, as determined by reading the leadframe strip paper map 240. This manual marking is also a tedious process where the wrong leadframe units can easily be marked by mistake because of the small size of the leadframe units and because of the difficulty of always correctly reading the paper leadframe strip map 240.

Next the symbolled and manually marked leadframe strip moves to the singulation operating station 220 where the leadframe strip is singulated, usually with a singulation saw. Singulation separates the connected individual leadframe units into separate leadframe units, which at this point, may also be referred to as integrated circuit (IC) packages.

The singulated leadframe units/integrated circuit (IC) packages, thus formed, are then moved to a scraping station 222 where they are manually scraped off a tacky dicing tape surface, on which the subject leadframe strip was mounted prior to singulation. The IC packages are then sorted by operators, who separate the manually marked, defective packages from the manually unmarked, good (non-defective) integrated circuit packages.

The next operating station is generally the final testing station 224 where in some production lines the good (non-defective) integrated circuit packages are tested a final time. The leadframe packages that pass the final test are then packaged for shipping, usually on a tape reel, at the pack and ship operating station 226. The tape reel or other IC package container is then shipped to customers.

Figure 6:
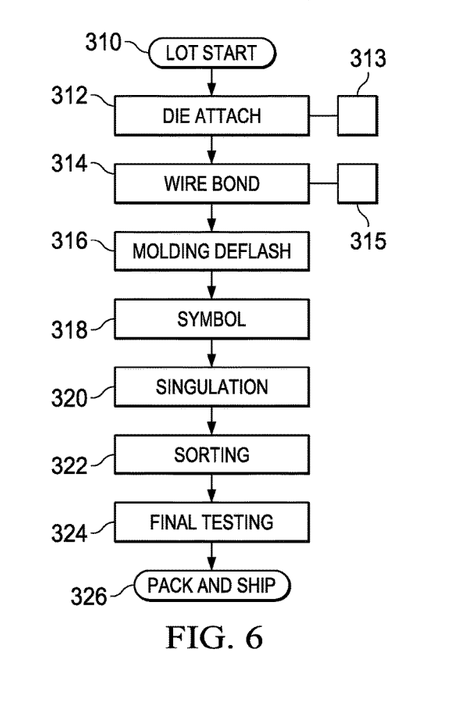
FIG. 6 is a flow diagram of an example IC package production line.

FIG. 6 is a flow diagram of an example IC package production line 300.

Figure 7:
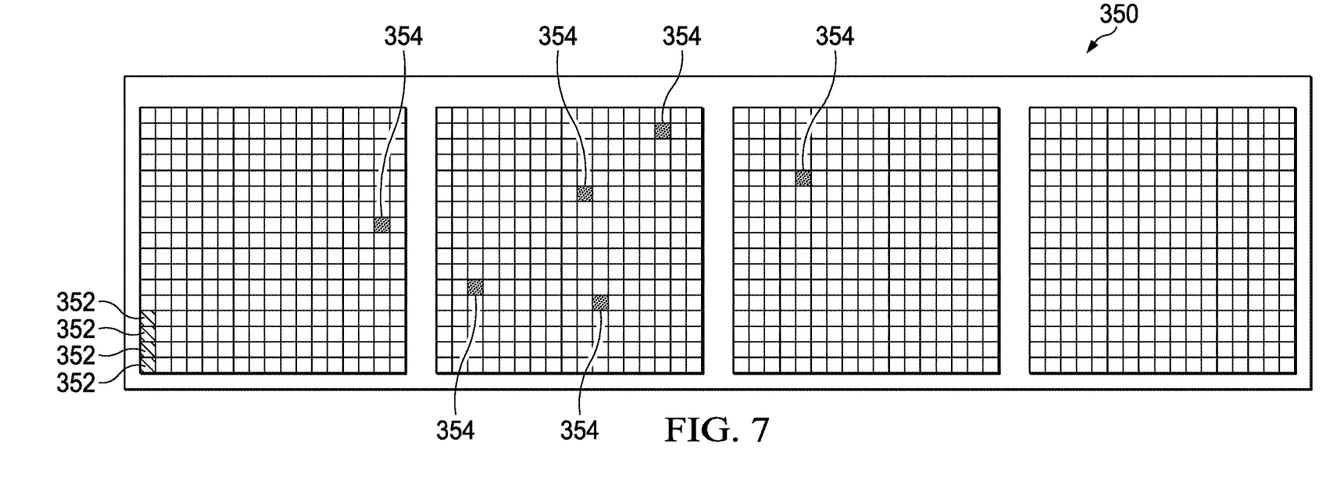
FIG. 7 is a schematic illustration of an example electronic leadframe strip map.

FIG. 7 is a schematic illustration of an example strip map database 350 which may be or be part of a database that is operably associated with the IC package production line 300. The strip map database 350, in one example embodiment, is a two dimensional array that has cells corresponding to the locations of leadframe units of the leadframe strip. The strip map database 350 may be implemented on hardware, such as firmware, or software, such as by a computer readable database or a computer-readable program.

As shown by FIG. 6, an unprocessed leadframe strip, which may be the same or similar to the leadframe strip 10, FIG. 2, enters the production line 300 at a first station 310.

The leadframe strip next enters a die attach station 312 where integrated circuit dies are attached to die attach pads, such as die attach pads 22, FIG. 2, of the leadframe units, e.g., leadframe units 18, of the leadframe strip, e.g., leadframe strip 10, FIG. 2. At the die attach station 312, a die attach station testing system 313, which may comprise one or more die attach testing devices, tests the leadframe strip for defects. The one or more testing devices may be, for example, a Pattern Recognition System (PRI). Any leadframe unit that is determined to be defective by the die attach station testing system 313 is electronically recorded on the strip map database 350. The electronically recorded defective leadframe unit locations are indicated in FIG. 7 by cross hatched cells 352.

The leadframe strip, e.g. leadframe strip 10, FIG. 2, next enters a wire bond station 314. There, integrated circuit dies, such as die 3, FIG. 1, are electrically connected by bond wires, e.g. bond wires 5, FIG. 1, to leads, e.g., leads 6, FIG. 1, of each leadframe unit, e.g. unit 18, FIG. 2. At the wire bond station 314 a wire bond testing system 315, which may comprise one or more wire bond testing devices, tests the leadframe units on the leadframe strip for defects. The one or more testing devices may include, for example, a Bond Integrity System (BITS) or a Pattern Recognition (PR) System. Any leadframe unit that is determined to be defective by the wire bond station testing system 315 is recorded on the strip map database 350, as shown schematically in FIG. 7 by the speckled cells 354. In some embodiments of the production line 300, the cells 354 associated with the defective leadframe units that are detected by the wire bond station testing system 315 are recorded in a manner that makes them distinguishable from the cells 352 associated with the defective leadframe units detected by the die attach station testing system 313. This differentiation may help to determine whether the subject operating station is responsible for producing an unacceptably large number of defective leadframe units, allowing corrective action may be taken.

Next the leadframe strip enters the molding and deflash station 316 where molding and deflash occur. If an operator notices any defects in the leadframe units at this station, he/she may, in some example embodiments, manually record the location of defective leadframe units on the strip map database 350 as by use of the input device, such as a keyboard.

The leadframe strip next enters the symbol station 318. At this station, using the information recorded on the strip map database 350, a symbolling system performs operations on leadframe units, such as marking or not marking units with indicia, to indicate whether or not the leadframe units are defective. In some example embodiments, only the good leadframe units are symbolled and the defective units are left unsymbolled. The symbolling system may use machine vision or other means for detecting the precise location of each leadframe unit that is symbolled in the symbolling operation. In some embodiments the type of marking performed at this station 318 corresponds to the symbol marking of station 218 of FIG. 2, i.e., indicia that convey certain information about the leadframe unit, such as a pin 1 indicator, a device code and a lot tracing code. However, in this example embodiment, only the nondefective units are marked. Thus, in this example embodiment, symbolling serves two functions—it provides information about the units marked and it also indicates that the symbolled units are not defective. It obviates the need for separate "inking" of defective units described above with reference to FIG. 2, with associated savings in time, material costs and labor costs—a significant improvement in the technology.

Next the leadframe strip enters a singulation station 320 where the encapsulated and symbolled leadframe strip is singulated to separate the leadframe units into individual integrated circuit (IC) packages. In the example embodiment in which only good leadframe units were symbolled at the symbolling station, only good IC packages will bear the symbol markings.

The singulated leadframe strip, which at this point is a plurality of IC packages, next enters a sorting station 322. At this station, a machine vision system or other system, for example an RFID reader for reading RFID type markings, determines whether each of the IC packages are good or defective. Based upon that determination, a pick and place machine, or the like, physically sorts the defective IC packages from the good packages, as by transferring them to separate collection bins. In the example embodiment where only good leadframe units are symbolled, the machine vision system identifies the symbolled IC packages as good packages and separates them from the unsymbolled IC packages.

Next the good IC packages, in some example embodiments, are transferred to a final testing station 324 where they are tested a final time for defects. After this final testing the IC packages that pass the final test may be sent to the packing and shipping station 326 where, for example, the IC packages may be placed on tape reels that are subsequently shipped to customers. In some production lines, one or more final tests are performed on the nominally good IC packages before shipping and any newly detected defective IC packages are removed. In other embodiments no such final testing and sorting is performed.

Figure 8:
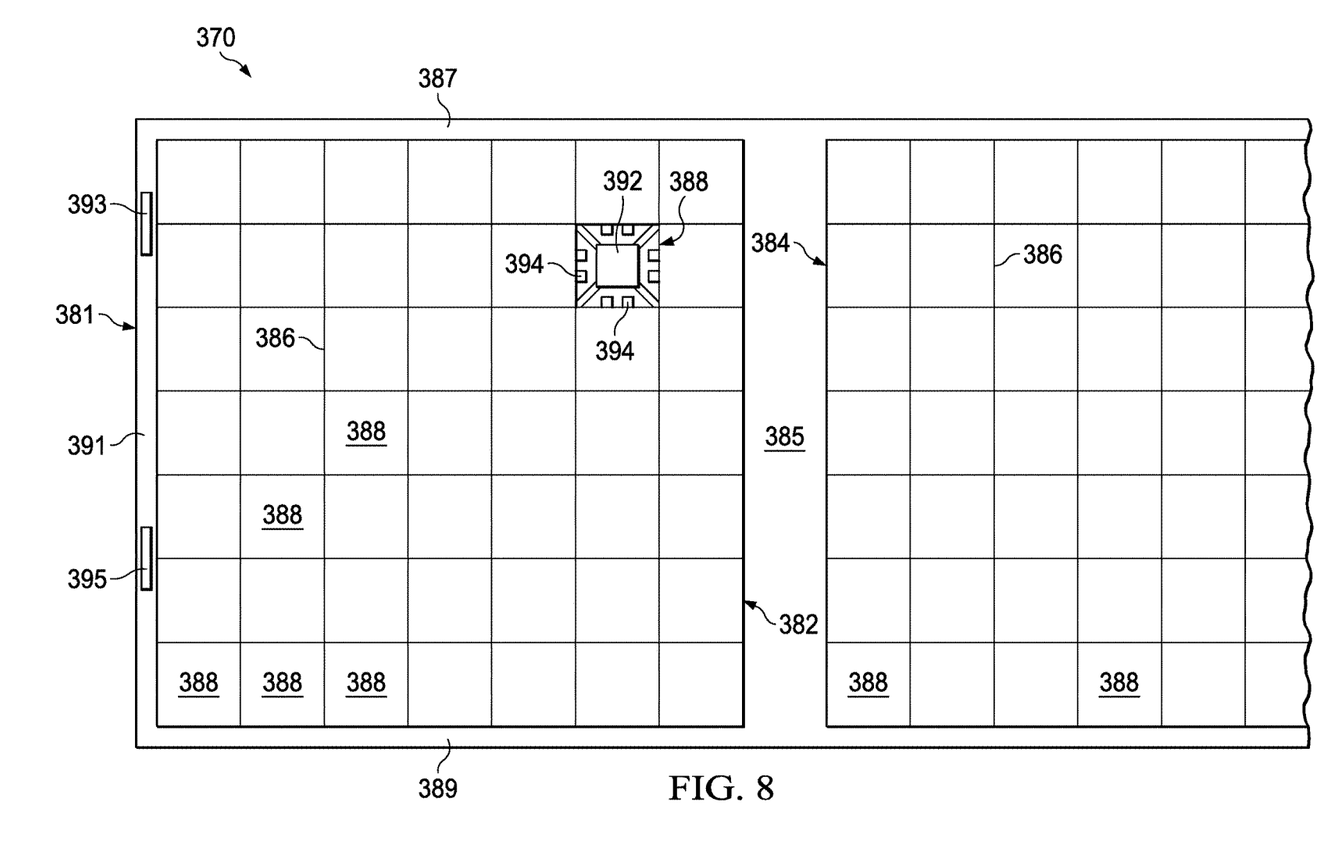
FIG. 8 is a schematic top plan view of a leadframe strip marked with leadframe strip identifying indicia.

Having thus described one example IC package production system and method, another example IC package production system and method will now be described with reference to FIGS. 8 and 9. FIG. 8 is a schematic top plan view of another embodiment of a leadframe strip 370. The leadframe strip 370 has a plurality of leadframe panels 382, 384, etc., separated by panel spacer portions 385, etc. Each panel 382, 384, etc., is arranged in a grid 386 of integrally connected leadframes 388. The leadframe strip 370 has a peripheral border portion 381 including a top rail 387, a bottom rail 389, and opposite end rails 391 (only one shown). Each leadframe 388 may include at least one die attachment pad 392 and a plurality of peripheral leads 394. After being processed by a strip marking station of an IC package production line, as described below with reference to FIG. 9, the leadframe strip 370 has ID codes 393 and 395 provided thereon, which are unique to that leadframe strip.

Figure 9:
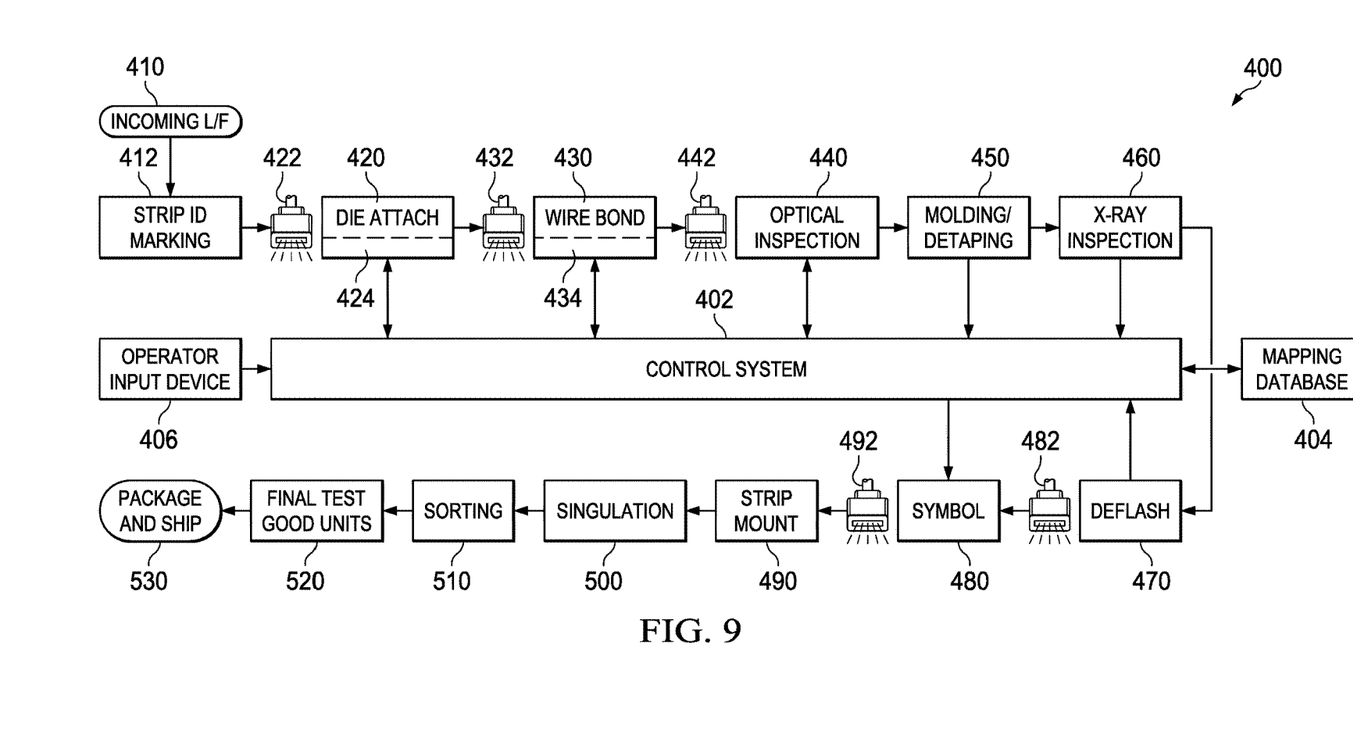
FIG. 9 is a flow diagram of an example IC package production line.

FIG. 9 is a flow diagram for another example IC package production line 400. The production line 400 comprises a control system 402 with a central data processing unit. A database 404 is operatively associated with the control system 402. The database 404, in one example embodiment, includes a two dimensional array, such as array 350 described above with reference to FIG. 7, which is configured to correspond to the configuration of the subject leadframe strip 370, FIG. 8. Various tools, including software and firmware, may be used to generate the two dimensional array. The control system 402 also includes, or is coupled to, an operator input device 406, such as a keyboard.

An unmarked version of leadframe strip 370, FIG. 8, enters the production line 400 at entrance 410 and then enters a leadframe strip ID (identification) marking station 412. At the marking station 412, the leadframe strip 370 has identification codes marked thereon. In some examples, the codes include a two-dimensional ID code 393 and an alpha numeric ID code 395, which in one embodiment is 18 alpha numeric characters in length. The ID codes 393, 395 may be laser printed onto a border portion 381 of the leadframe strip 370, such as on an end rail 391. The ID codes 393, 395 may, as examples, include a strip ID and a lot ID. The lot ID identifies the type of IC packages that are to be produced from the leadframes 388 in the leadframe strip 370. The strip ID is unique for each leadframe strip. In another embodiment both codes 393, 395 are the same unique strip ID number in different forms.

The lot identification code of the leadframe strip is entered into the control system 402. In some examples, the lot identification code is entered at the die attach station 420, such as by an operator. In other embodiments the lot identification code is marked on the leadframe strip before it enters the production line 410 and this lot identification code it is read at the die attach station 420 by an optical reader 422 or other device operable to read identification codes. The lot identification code in some example embodiments is correlated with the recipe for materials to be used and operations to be performed on the leadframe strip at the die attach station 420. In other example embodiments the recipe for materials, etc. may be correlated to the strip ID. In other example embodiments the recipe to be used with incoming leadframes is input to the control system by other means, for example by direct manual input by the operator through an operator input device 406. The die attach station 420 loads the appropriate dies and attachment material, etc., as specified by the recipe.

At the die attach station 420, a die, is attached, in accordance with the recipe, to each leadframe die pad. Then, a die attach testing system 424, which may comprise one or more separate die attach testing machines, tests the leadframe strip 370 for defective leadframe units. Data indicative of the location of defective leadframe units is then sent to the control system 402. The control system 402 uses this data to update the database 404 to indicate the locations of the newly detected, defective leadframe units. In one embodiment of the system 400, the die attach testing system 424 uploads to the control system 402 a database 404 that corresponds to the current leadframe strip 370. The corresponding database 404 is selected based upon the leadframe strip ID. In other embodiments it may be selected based upon a lot ID, direct operator input or other means as described above.

In a variation of the die attach and inspection operations described above, when the die attach system fails to attach a die to one or more die pads in the subject leadframe strip, for example because of lack of die attach paste, equipment at the die attach station detects this failure and inputs this information to the control system, which records the location of this failed operation. The operation by which the system detects the missing die paste, etc., is also considered a "test" and the hardware, software, etc., that makes this determination is considered to be testing equipment, as those terms are used in this disclosure. Thus, the database 404 is updated with this information as well as any defect information determined by any other die attach station testing equipment. In some embodiments this "attempted and failed operation" information is stored by the system 402 like other test information to indicate the locations of units where the operation was unsuccessful and this information is used to prevent other testing of the leadframe units where the attempted and failed operation occurred. An advantage of such an arrangement is that time, materials and energy is not wasted attempting to test leadframe units that may not be testable because of the attempted and failed operation. In some situations, attempting to test such leadframe units with no die installed might cause damage to the production station or to the subject leadframe strip. Thus, detecting where "attempted and failed operations" occur as part of testing represents another significant improvement to the technology over the system described with reference to FIG. 3.

Next the leadframe strip 370, with attached dies, moves to the wire bond station 430. At the wire bond station 430, an associated code reader 432 reads the identification code to identify the leadframe strip 370. The identification code read may include at least one of the two ID codes 393, 395 described above. In some embodiments, the strip ID code read from the ID code 393 and/or 395 is correlated with a lot ID code that was input to the system. If strip ID code and the lot ID code do not properly correspond, the system indicates an error and/or shuts down the production line so that corrective action can be taken.

At the wire bond station 430, the attached dies are wire bonded to associated leadframe leads. Then a wire bond testing system 434, which may include one or more wire bond testing machines, tests the leadframe strip 370 for defects. For example, the wire bonds on the individual leadframe units may be tested to identify defective leadframe units. Data indicative of the location of all detected defective leadframe units is then sent by the testing system 434 to the control system 402, which uses the data to update the database 404. The wire bond station, like the die attach station, may have equipment, separate from the other defect testing equipment that notifies the control system 402 of the locations of leadframe units where wire bonding was attempted unsuccessfully. Such test information may be used to prevent further testing of those leadframe units, etc.

The leadframe strip 370 with the attached and wire bonded dies is next moved to the optical inspection system 440. After identifying the leadframe strip 370 through use of a code reader 442, such as described above, the leadframe strip 370 is optically inspected. The optical inspection system 440 may identify the locations of certain predetermined types of defects that are not likely to by discovered by the die attach testing system 424 and wire bonding test system 434. For example, testing at the optical inspection station 440 may detect any of the following types of defects: non-stick on die pad, non-stick on lead, lifted ball, broken wire, sag wire, etc. The locations of such defects are, in some example embodiments, automatically uploaded by the optical inspection system 440 to the control system 402, which uses this information to update the database 404. In other example embodiments, defective leadframe unit location information may be manually uploaded to the control system 402 through use of an operator input device 406, such as a keyboard, after the operator views the leadframe strip 370, either directly or on an associated monitor (not shown).

Next the leadframe strip 370 enters a molding and detaping station 450. At this station the leadframe strip 370 is encapsulated, such as by covering the leadframe strip 370 in mold compound, which hardens into a protective encasement. Some leadframe strips ("pre-tape leadframe strips")

are taped with support tape on the leadframe strip back side prior to entering the production line 400 to provide extra support for the leadframe strips during certain IC package formation processes. The tape is removed from pre-taped leadframe strips at the molding and de-taping station. In some example embodiments, any molding or de-taping defects are uploaded to the control system 402. For examples, defects that are noticed by an operator may be manually uploaded to the control system 402 using the operator input device 406. The control system 402 then updates the database 404 with the locations of the defective leadframe units.

Next the leadframe strip 370, as modified by encapsulation, is sent to an x-ray inspection station 460 where the leadframe strip 370 is x-ray inspected. Again, the locations of defective leadframe units is transmitted to the control system 402 to update the database 404. For example, an operator may review the x-ray inspection results and, using the operator input device 406, the operator manually uploads the location of the defective leadframe units that he/she sees to the control system 402. The control system 402 then updates the database 404 as described above.

The leadframe strip 370 then enters the deflash station 470 where mold flashing is removed from the leadframe strip 370. The locations of leadframe units that are deemed defective during the removal of the flashing are transmitted to the control system 402, which updates the database 404 accordingly. In some embodiments, the operator inspects the leadframe strip 370 for defects produced by the deflashing operation and manually uploads the locations of all defective leadframe units that he/she sees to the control system 402 using the input device 406. The control system 402 updates the database 404 with this information.

At another optical reader station 482 downstream from the deflash station, the molded and deflashed leadframe strip 370 may be subjected to another identification and/or correlation operation or test as described above. If the leadframe strip 360 passes the identification/correlation test, the leadframe strip 370 proceeds through the production line 400 to the symbol station 480. At the symbol station 480, the control system 402, using the information in the database 404, symbols (marks) leadframe units in a manner to indicate whether they are defective or non-defective (good). In one example embodiment, only the good (non-defective) leadframe units are symbolled and the defective units are left unsymbolled. As described above, the symbolling of a leadframe unit provides certain predetermined information about the leadframe units, such as a pin 1 indicator. The symbolling provided at the symbolling station 480 on the good units may include laser marking or inkjet marking. As described with reference to FIG. 6, symbolling only the good units eliminates the need for the "inking" process described with reference to FIG. 3.

The symbolled leadframe strip 370 next enters a strip mount station 490 where a code reader 492 reads identification code for the purpose of identifying the leadframe strip 370. At this station 490, the leadframe strip is mounted on dicing tape attached to a ring. The ID codes 393 and 395 read by the code reader 492 are converted to a format, such as a barcode, that is printed on a strip label (not shown). This strip label is attached to the dicing tape so that the ID code for the leadframe strip can be read at one or more downstream stations after singulation takes place. This operation is performed because singulation, which occurs at the next station, removes or obscures the peripheral portion 391 of the leadframe strip 370 on which the ID codes 393, 395 are provided.

The leadframe strip 370 then undergoes "dicing"/"singulation" at the singulation station 500, at which time the leadframe units of the leadframe strip 370 are separated or singulated into multiple separate IC packages. An example of such an IC package 1 is shown in FIG. 1. The singulation may be performed through use of a singulation saw, a "stealth laser," a stamping press, etc.

Next the leadframe strip 370, which at this point comprises multiple IC packages attached to dicing tape, is moved to a sorting station 510. At the sorting station 510, machine vision may be employed to read the identification, such as the bar coded strip label mounted on the dicing tape at the strip mount station 490, to identify the singulated leadframe strip 370 and to correlate it with the lot number as previously described. Machine vision may also be employed at the sorting station 510 to determine whether each IC package is a symbolled IC package or an unsymbolled IC package. In an example embodiment in which defective leadframe units are unsymbolled, the unsymbolled packages are removed from the production line at the sorting station 510, as through the use of a conventional pick and place machine (not shown). In some example embodiments, at this point in the process, the remaining, i.e., symbolled, IC packages enter a package and ship station 530. At this station the symbolled IC packages are packaged in appropriate shipping media, such as tape reels, and shipped to customers. In other embodiments the symbolled IC packages undergo further testing at a final test station 520 for nominally good units. Then, only those symbolled IC packages that pass the final test(s) at the final test station 520 are sent to the package and ship station 530, where these IC packages are prepared for shipment and sent to customers.

Figure 10:
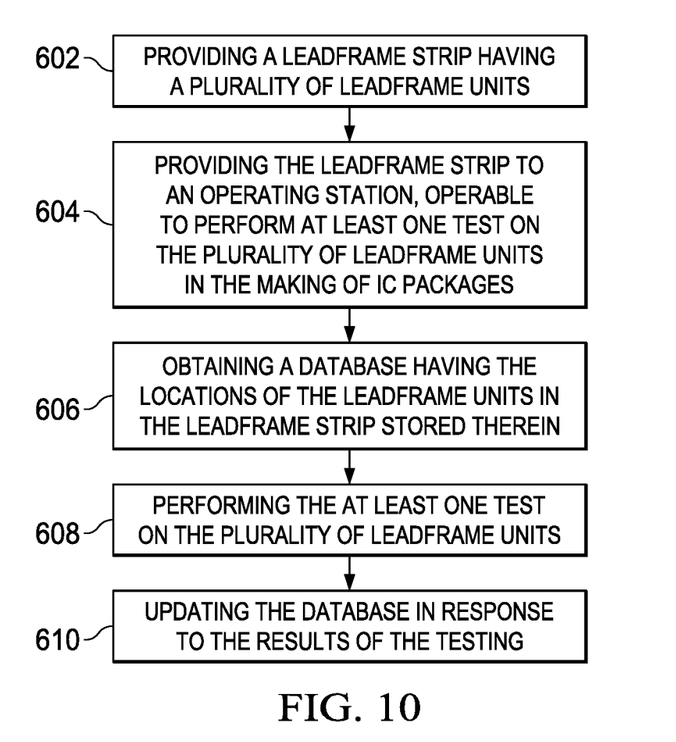
FIG. 10 is a flow chart illustrating a method of making integrated circuit packages.

FIG. 10 is a flow chart illustrating a method of making integrated circuit (IC) packages. The method includes, as shown at block 602, providing a leadframe strip having a plurality of leadframes units. The method also includes, as shown at block 604, providing the leadframe strip to an operating station operable to perform at least one test on the plurality of leadframe units in the making of IC packages. The method further includes, as shown at block 606, obtaining a database having the locations of leadframe units in the leadframe strip stored therein. The method includes, as shown at block 608, performing the at least one test on the plurality of leadframe units. The method includes, as shown at block 610, updating the database in response to the results of the testing Thus, as describe in detail above, the database 404 may be analyzed in real time to determine if a manufacturing process is being performed improperly. For example, if all leadframe units at particular locations on respective leadframe strips are determined to be defective after having a specific manufacturing process applied to them, there is likely a problem with the associated production station. The database 404 may be analyzed in real time to ascertain the existence and source of this problem so that it may be addressed. Such real time analysis is not available with the paper based IC production line 200 described above.

The database 402 provides many other benefits over cards and the like used in other IC package production systems. For example, in some example processes, the production station performing a process on the leadframe strip only performs the process on leadframe units on which all downstream recipe processes have actually been performed and/or which are not defective as identified in the database 404. In the case of wire bonding, only leadframe units that have had die attach performed thereon and that have passed previous tests are wire bonded. This saves time by not wire bonding incomplete or defective leadframe units and reduces costs by not expending gold wire in an attempt to wire bond incompletely processed or defective leadframe units. In the paper system, data identifying the locations of defective leadframe units, etc., is not entered at the time the defects are determined, so procedures performed at that station are performed on all the leadframe units including defective units. In a similar manner in the production line 400, testing may only be performed on good leadframe units as identified by the database 404. Accordingly, time and energy spent testing defective leadframe units is saved, and time and energy spent and materials used performing production operations on defective units is also saved by the production line 400. Thus, the described production line 400 represents a substantial improvement over paper based production lines such as production line 200.

Although certain specific embodiments of systems and methods for making integrated circuit packages have been expressly described in detail herein, alternative embodiments of such systems and methods will occur to those skilled in the art after reading this disclosure. It is intended that the language of the appended claims be construed broadly to cover such alternative embodiments, except as limited by the prior art.

What is claimed is:

1. A method for making integrated circuit (IC) packages, the method comprising:
   providing a leadframe strip having a plurality of leadframe units;
   providing the leadframe strip to an operating station that is operable to perform at least one test on the plurality of leadframe units in the making of IC packages;
   obtaining a database having the locations of leadframe units in the leadframe strip stored therein;
   performing the at least one test on the plurality of leadframe units;
   updating the database in response to the results of the at least one test; and
   marking leadframe units that passed the testing with indicia.

2. The method of claim 1, further comprising performing at least one procedure on the plurality of leadframe units, wherein the at least one test tests the at least one procedure.

3. The method of claim 2, wherein updating the database includes identifying the locations of leadframe units that had the at least one procedure performed thereon.

4. The method of claim 1, further comprising:
   encapsulating the leadframe units;
   reading the database to determine the locations of leadframe units that passed the testing;
   singulating the leadframe units;
   reading the indicia on the leadframe units; and
   sorting the leadframe units that passed the testing from leadframe units that did not pass the testing in response to reading the indicia on the leadframe units.

5. The method of claim 1, further comprising:
   providing the leadframe strip to an operating station that is operable to perform at least one procedure on the plurality of leadframe units;
   reading the updated database to determine the locations of leadframe units that passed the at least one test; and
   performing at least one procedure only on the leadframe units that passed the at least one test.

6. The method of claim 5, wherein the obtained database includes information associated with the at least one procedure to be performed on the leadframe units; and wherein the performing the at least one procedure on the plurality of leadframe units includes performing the at least one procedure in response to the information associated with the at least one procedure included in the database.

7. The method of claim 5, further comprising:
   performing a second test on the plurality of leadframe units to which at least one second procedure was applied; and
   updating the database in response to the second test.

8. The method of claim 7, further comprising:
   encapsulating the leadframe units;
   reading the database to determine the locations of leadframe units that passed the first test and the second test;
   marking leadframe units that passed the first test and the second test with indicia;
   singulating the leadframe units;
   reading the indicia on the singulated leadframe units; and
   sorting the singulated leadframe units that passed the first test and the second test from leadframe units that did not pass the first test and the second test.

9. The method of claim 1, further comprising:
   marking the leadframe strip with strip identifying indicia; and
   reading the strip identifying indicia;
   wherein obtaining a database having the locations of leadframe units in the leadframe strip stored therein comprises obtaining a database correlated with the read strip identifying indicia.

10. The method of claim 1, wherein updating the database includes updating the database to identify the locations of leadframe units that passed the test.

11. The method of claim 1, wherein updating the database includes updating the database to identify the locations of leadframe units that failed the test.

12. An integrated circuit (IC) package production device for performing at least one procedure in the production of IC packages on a plurality of leadframe units, the leadframe units being affixed to a leadframe strip, the leadframe strip having strip identifying indicia located therein, the device comprising:
    a reader operable to read the strip identifying indicia affixed to the leadframe strip;
    a mechanism operable to perform at least one production procedure on the plurality of leadframe units; and
    a processor operable to correlate the identification of the leadframe strip to a database that identifies locations of leadframe units on the leadframe strip, and operable to update the database to identify locations of leadframe units on which the at least one production procedure was performed.

13. The device of claim 12, further comprising a tester operable to test the leadframe units on which the at least one production procedure was performed and to update the database to identify locations of leadframes assembly units that passed the test.

14. The device of claim 13, further comprising:
    a singulation device operable to singulate leadframe units from the leadframe strip; and
    a sorting device operable to separate singulated leadframe units that passed the test from singulated leadframe units that did not pass the test.

15. The device of claim 13, wherein the mechanism is operable to encapsulate the leadframe units, and further comprising:
    a marking device for marking encapsulated leadframe units that passed the test with indicia;
    a singulation device operable to singulate the leadframe units;

a reading device operable to read the indicia marked on the singulated leadframe units; and a sorting device operable to sort singulated leadframe units that passed the test from singulated leadframe units that did not pass the test in response to reading the indicia.

16. The device of claim 13, wherein the tester is operable to only test leadframe units that had the at least one production procedure applied thereto.

17. The device of claim 12, wherein the mechanism is operable to perform at least one of die attachment or wire bonding.

18. An integrated circuit (IC) test station for testing a plurality of leadframe units affixed to a leadframe strip, the leadframe strip having identification indicia located thereon, the station comprising:

a reader operable to read the identification indicia affixed to the leadframe strip;

a testing device operable to test the plurality of leadframe units; and a processor operable to correlate the identification of the leadframe strip to a database that identifies locations of leadframe units on the leadframe strip, and operable to update the database to identify locations of leadframe units in response to the testing performed by the testing device.

19. The station of claim 18, further comprising a mechanism for performing a procedure only on the leadframe units that passed the testing.

20. The station of claim 18, wherein the database identifies the locations of leadframe units that had at least one procedure previously applied to them, and wherein the testing is performed on the leadframe units that had the procedure previously applied to them.

21. A method for making integrated circuit (IC) packages, the method comprising:

providing a leadframe strip having a plurality of leadframe units;

providing the leadframe strip to an operating station that is operable to perform at least one test on the plurality of leadframe units in the making of IC packages;

obtaining a database having the locations of leadframe units in the leadframe strip stored therein;

performing the at least one test on the plurality of leadframe units;

updating the database in response to the results of the at least one test; and marking the leadframe strip with identifying indicia.

22. The method of claim 21, further comprising:

encapsulating the leadframe units;

reading the database to determine the locations of leadframe units that passed the testing;

marking leadframe units that passed the testing with indicia;

singulating the leadframe units;

reading the indicia on the leadframe units; and sorting the leadframe units that passed the testing from leadframe units that did not pass the testing in response to reading the indicia on the leadframe units.

23. The method of claim 21, further comprising:

providing the leadframe strip to an operating station that is operable to perform at least one procedure on the plurality of leadframe units;

reading the updated database to determine the locations of leadframe units that passed the at least one test; and performing at least one procedure only on the leadframe units that passed the at least one test.

24. The method of claim 23, wherein the obtained database includes information associated with the at least one procedure to be performed on the leadframe units; and wherein the performing the at least one procedure on the plurality of leadframe units includes performing the at least one procedure in response to the information associated with the at least one procedure included in the database.

25. The method of claim 23, further comprising:

performing a second test on the plurality of leadframe units to which at least one second procedure was applied; and updating the database in response to the second test.

26. The method of claim 24, further comprising:

encapsulating the leadframe units;

reading the database to determine the locations of leadframe units that passed the first test and the second test;

marking leadframe units that passed the first test and the second test with indicia;

singulating the leadframe units;

reading the indicia on the singulated leadframe units; and sorting the singulated leadframe units that passed the first test and the second test from leadframe units that did not pass the first test and the second test.

27. The method of claim 21, further comprising:

marking the leadframe strip with strip identifying indicia; and reading the strip identifying indicia;

wherein obtaining a database having the locations of leadframe units in the leadframe strip stored therein comprises obtaining a database correlated with the read strip identifying indicia.

* * * * *